United States Patent
Wu et al.

[11] Patent Number: 5,913,129
[45] Date of Patent: Jun. 15, 1999

[54] METHOD OF FABRICATING A CAPACITOR STRUCTURE FOR A DYNAMIC RANDOM ACCESS MEMORY

[75] Inventors: Der-Yuan Wu, Hsinchu; Chuan-Fu Wang, Taipei Hsien, both of Taiwan

[73] Assignee: United Microelectronics Corp., Hsin-Chu, Taiwan

[21] Appl. No.: 09/005,554

[22] Filed: Jan. 12, 1998

[30] Foreign Application Priority Data

Nov. 27, 1997 [TW] Taiwan .................................. 86117834

[51] Int. Cl.⁶ ..................................................... H01L 21/20
[52] U.S. Cl. ........................... 438/398; 438/255; 438/396
[58] Field of Search .................................... 438/253, 254, 438/255, 396, 397, 398

[56] References Cited

U.S. PATENT DOCUMENTS

| | | | |
|---|---|---|---|
| 5,354,705 | 10/1994 | Mathews et al. | 438/398 |
| 5,760,434 | 6/1998 | Zahurak et al. | 438/398 |
| 5,817,555 | 10/1998 | Cho | 438/255 |
| 5,827,766 | 10/1998 | Lou | 438/255 |

*Primary Examiner*—Tuan H. Nguyen
*Attorney, Agent, or Firm*—Merchant, Gould, Smith, Edell, Welter & Schmidt, P.A.

[57] ABSTRACT

A method of fabricating a capacitor structure for a dynamic random access memory. This method comprises the following steps: a transistor is provided on a semiconductor substrate, and spacers are formed over the sidewalls of a gate electrode of the transistor. A first oxide layer is formed over the transistor. A bit line is deposited to contact with the source region of the transistor. Thereafter, a second oxide layer is formed over the bit line. A contact opening is formed exposing the drain region. Then the hemispherical grained silicon layer is formed into the contact opening. A polysilicon layer is formed over the hemispherical grained silicon layer. Therefore both the hemispherical grained silicon layer and the third polysilicon layer have rough surfaces. Subsequent conventional processes for the complete formation of capacitor structure are performed. It is therefore the capacitor maintains a required capacitance while reducing the horizontal dimensions of the storage capacitor.

16 Claims, 7 Drawing Sheets

5,913,129

METHOD OF FABRICATING A CAPACITOR STRUCTURE FOR A DYNAMIC RANDOM ACCESS MEMORY

CROSS-REFERENCE TO RELATED APPLICATION

This application claims the priority benefit of Taiwan application serial no. 86117834, filed Nov. 27, 1997, the full disclosure of which is incorporated herein by reference.

BACKGROUND OF THE INVENTION

1. Field of the Invention

The invention relates in general to the fabrication of semiconductor integrated circuits (ICs), and more particularly to a method of fabricating a capacitor structure for a dynamic random access memory (DRAM).

2. Description of the Related Art

A DRAM is a widely used integrated circuit device, and it plays an indispensable role in the electronic industry. FIG. 1 is a circuit diagram illustrating a conventional DRAM memory cell. As shown in FIG. 1, a memory cell includes a transfer transistor T and a storage capacitor C. The source electrode of the transfer transistor T is coupled to a corresponding bit line BL. The drain electrode of the transfer transistor T is coupled to a storage electrode 6 of the storage capacitor C. The gate electrode of the transfer transistor T is coupled to a corresponding word line WL. An opposed electrode 8 of the storage capacitor C is coupled to a stationary voltage source $V_{CP}$. A dielectric layer 7 is deposited between the storage electrode 6 and the opposed electrode 8. As known by those skilled in this art, the storage capacitor C is used for storing data, and should have enough capacitance to avoid a loss of data.

In a conventional fabricating process for a DRAM device having a storage capacity below 1 MB, a two dimensional capacitance device, e.g., a planar-type capacitor, is widely used for storing data. As shown in FIG. 2, a field oxide layer 11 is formed on a substrate 10 to define an active region, then gate oxide layer 12, gate electrode layer 13, and source and drain electrode areas 14 are formed in sequence to form a transfer transistor T. On the surface of the substrate 10, a dielectric layer 7 and a conductive layer 8 are formed on one side adjacent to the drain. The area where the dielectric layer 7 and the conductive layer 8 join with the substrate 10 forms a storage capacitor C. However, the planar-type capacitor occupies a relatively large surface area of the device to form the storage capacitor C, which is at odds with the desire for large scale integration of the DRAM device.

A highly integrated DRAM, e.g., with a storage capacity of 4 MB or above, needs to use a three dimensional capacitance structure, such as a stack-type capacitor or a trench type capacitor, in order to realize a structure with reduced surface area requirements.

FIG. 3 is a cross-sectional diagram illustrating the structure of a conventional stack-type capacitor. On a substrate 10, a field oxide layer 11, a gate oxide layer 12, a gate electrode layer 13, and source-drain electrode areas 14 are formed in sequence to construct a transfer transistor T. Next, an insulating layer 15 is formed and a contact opening is formed by etching the source-drain electrode areas 14. Then, a first polysilicon layer 6, which is used as a storage electrode, a dielectric layer 7 and a second polysilicon layer 8, which is used as an opposed electrode, are formed in sequence on the device. In this way, a DRAM memory cell with stack-type capacitor C is completed. A memory cell should offer enough capacitance to assure the operational quality of the device as the size of the device is diminished. However, when a memory cell is even more highly integrated, such as when fabricating a DRAM with a storage capacity of 64 MB or above, the above mentioned structure of a stack-type capacitor is no longer adequate.

FIG. 4 is a cross-sectional diagram illustrating a structure of conventional trench-type capacitor C. First, a transfer transistor T is formed on a substrate 10 by ordinary processing, including a gate oxide layer 12, a gate electrode layer 13, and source-drain electrode areas 14. On the surface of the substrate 10, a deep trench is etched on the side adjacent to the drain electrode 14. Next, a storage capacitor C is formed within the deep trench. The storage capacitor C includes a dielectric layer 7, an opposed electrode polysilicon layer 8 and a storage electrode 6 which is formed by the sidewalls of the substrate 10. However, to raise the capacitance, the structure and the fabricating method of this kind of capacitor may increase the surface area of electrode. Further, during the forming of the deep trench by etching, lattice defects will be generated on the substrate that increase current leakage and influence the characteristics of devices. Also, as the aspect ratio is increased, the etching rate will be decreased which adds to the difficulty of processing and adversely affects the efficiency of production.

SUMMARY OF THE INVENTION

It is therefore an object of the invention to provide a method of fabricating a capacitor structure for a dynamic random access memory which maintains a required capacitance while reducing the horizontal dimensions of the storage capacitor.

To achieve these and other advantages and in accordance with the purpose of the invention, as embodied and broadly described herein, the invention includes a method of fabricating a capacitor structure for a dynamic random access memory. This method comprises the following steps: a transistor is provided on a semiconductor substrate, and spacers are formed over the sidewalls of a gate electrode of the transistor. A first oxide layer is formed over the transistor, the first oxide layer has a first contact opening exposing a source region of the transistor. A bit line is deposited into the contact opening and contact is made with the source region of the transistor. Thereafter, a second oxide layer is formed over the bit line and the first oxide layer. A silicon nitride layer is formed over the second oxide layer. A third oxide layer is formed over the silicon nitride layer. The third oxide layer and the silicon nitride layer are patterned to form an opening exposing the second oxide layer. A photoresist mask is used to expose the portions of the third oxide layer, and the portions of the third oxide layer exposed is removed until the silicon nitride is exposed, and the second oxide layer and the first oxide layer exposed by the opening are further removed to form a second contact opening which exposes a drain region of the transistor. The photoresist mask is removed, and a hemispherical grained silicon layer over the third oxide layer, the silicon nitride layer and the sidewalls of the second contact opening is deposited, and contact is made with the drain region which is exposed by the second contact opening, and a polysilicon layer is formed over the hemispherical grained silicon layer and into the second contact opening. The polysilicon layer and the hemispherical grained silicon layer over the third oxide layer is removed until the third oxide layer is exposed to form a bottom electrode. The third oxide layer exposed is further removed until the silicon nitride is exposed. A dielectric layer is formed over the bottom electrode, and a top electrode is formed over the dielectric electrode.

One of the characteristics of the invention is that the hemispherical grained silicon layer and third polysilicon layer are formed in sequence, therefore both the third polysilicon layer and the hemispherical grained silicon layer have a roughness surface. As a result, the invention is effective in increasing the capacitance of the capacitor.

The hemispherical grained silicon layer and the third polysilicon layer are formed in sequence in the present invention. Thus the third polysilicon layer could be used as an etching protection layer. Therefore, the invention is effective in preventing the formation of the current leakage.

The cylinder shaped bottom electrode is formed to increase the surface area of the bottom electrode, and the tantalum oxide dielectric layer having a high dielectric constant, is used to increase the capacitance of the capacitor. It is therefore the capacitor maintains a required capacitance while reducing the horizontal dimensions of the storage capacitor.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

FIGS. 5A to 5J are cross-sectional views showing the process steps of one preferred embodiment of the method for fabricating a capacitor structure for a dynamic random access memory.

Figure 1:
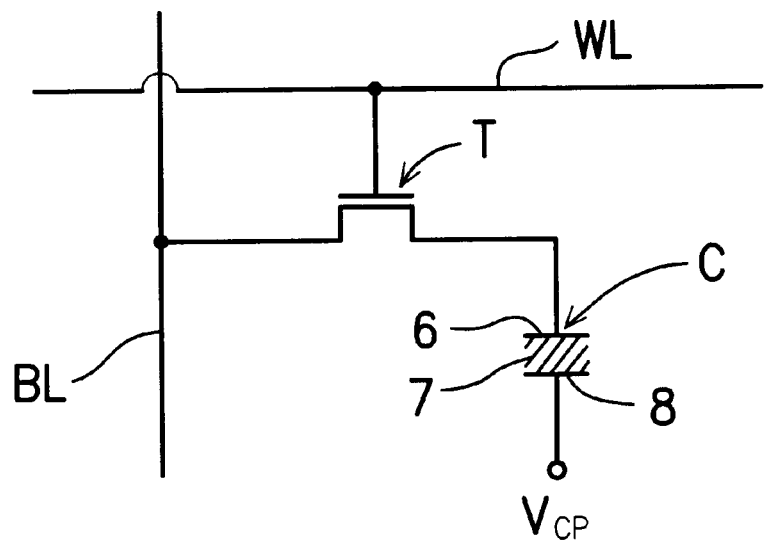
FIG. 1 is a circuit diagram illustrating a conventional DRAM memory cell.
Figure 2:
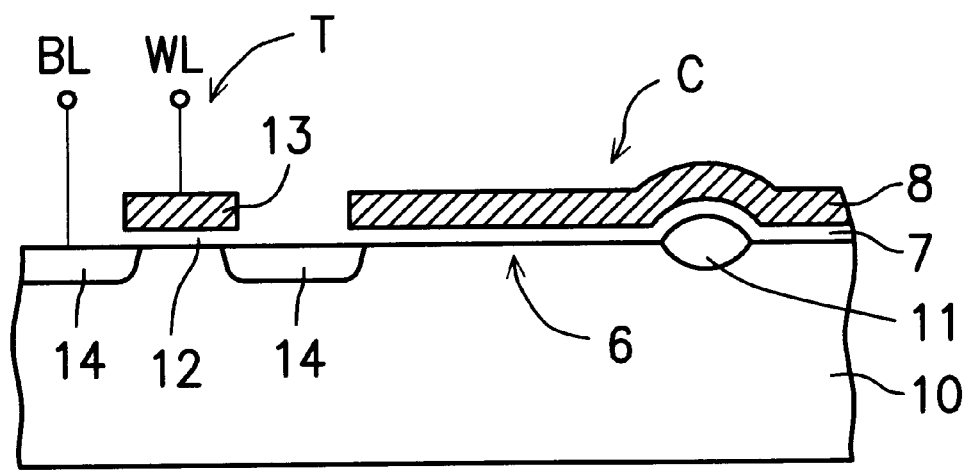
FIG. 2 is a cross-sectional diagram illustrating the structure of a conventional DRAM memory cell with a planar-type capacitor.
Figure 3:
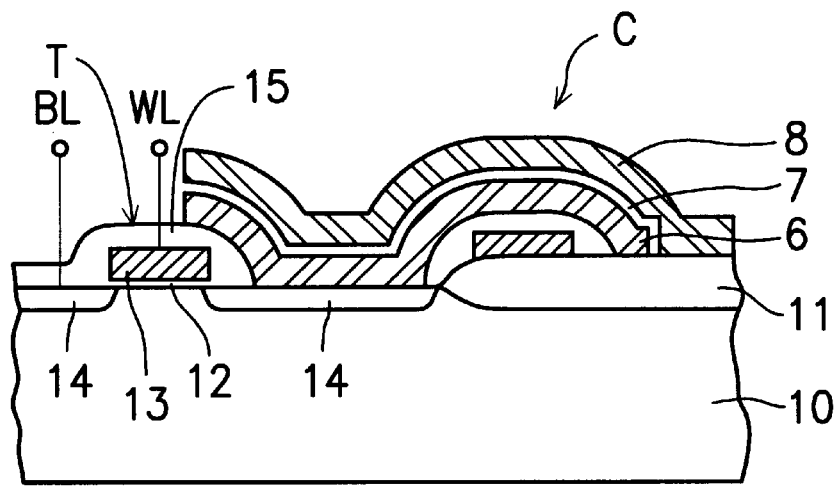
FIG. 3 is a cross-sectional diagram illustrating the structure of a conventional DRAM memory cell with a stack-type capacitor.
Figure 4:
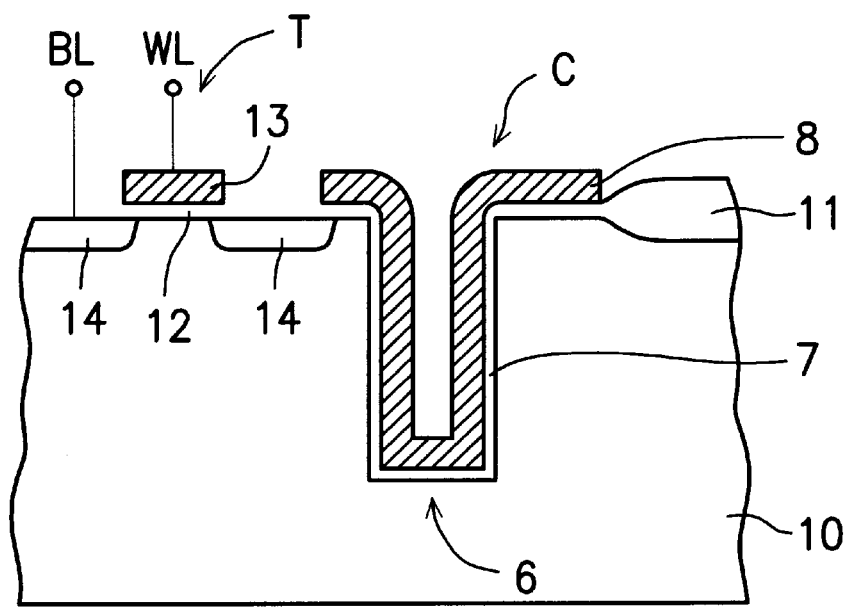
FIG. 4 is a cross-sectional diagram illustrating the structure of a conventional memory cell with a trench-type capacitor.
Figure 5A:
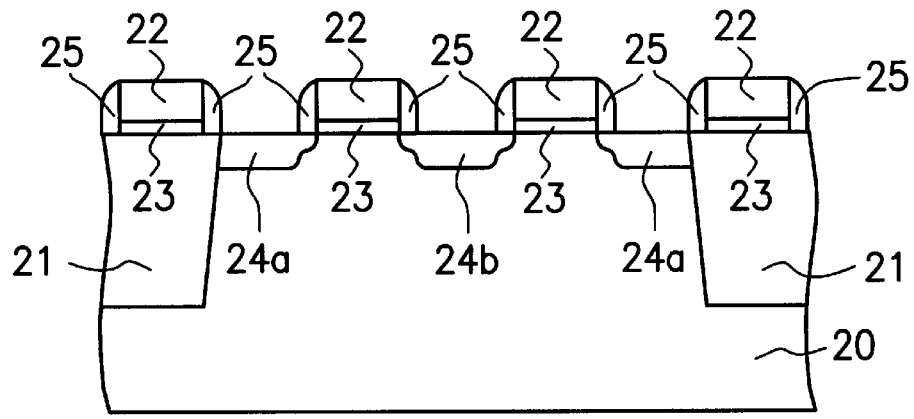
FIGS. 5A to 5J are cross-sectional views showing the process steps of one preferred embodiment of the method for fabricating a capacitor structure for a dynamic random access memory.

Referring first to FIG. 5A, a semiconductor substrate 20 is provided, and isolation structures 21, e.g. shallow trench isolation structures or field oxides, are formed on the semiconductor substrate 20 to define the active region.

Next, transistors are formed on the active region. A gate oxide layer 23, gate electrodes 22 above the gate oxide layer 23, and doped source/drain areas 24a and 24b are formed in sequence to construct transistors T. The gate electrodes 22 comprises a doped polysilicon layer, and the doped polysilicon layer is deposited to a thickness of about 500~1500 Å, e.g. 1000 Å, by Low pressure chemical vapor deposition (LPCVD). Moreover, before spacers are formed in the subsequent step, the source/drain regions 24a and 24b are lightly doped herein.

Thereafter, a layer of silicon nitride material is deposited to a thickness of about 1000 Å by plasma enhanced chemical vapor deposition (PECVD) to cover the entire substrate structure. Next, spacers 25 are formed over the sidewalls of the gate electrodes 22 by etching back the layer of silicon nitride material. Moreover, the source/drain regions 24a and 24b on the active regions are exposed by the two sides of the gate electrodes 22. Later, using the spacers 25 as the mask layers, high concentration ions are doped into the source/drain regions 24a and 24b by the implantation method. Moreover, the spacers comprise silicon nitride, they could be used as etching protection layers during the subsequent etching step.

Figure 5B:
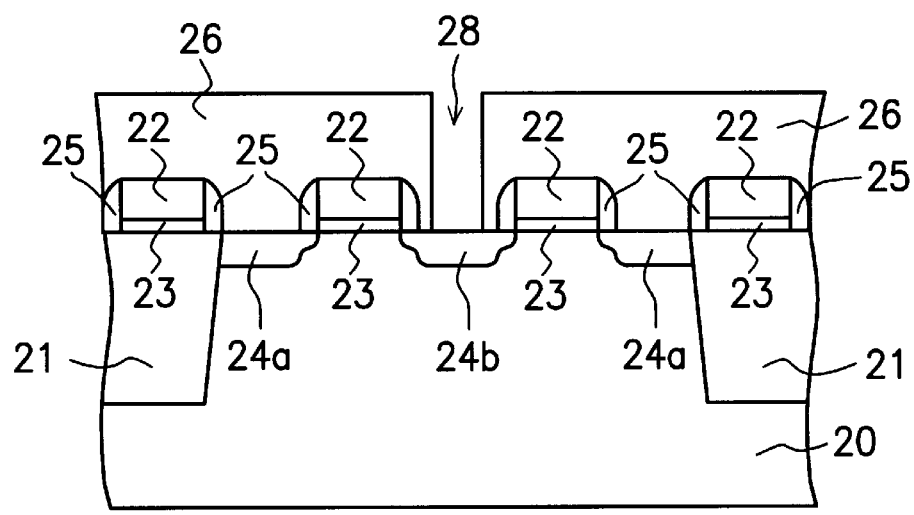

Referring to FIG. 5B, a layer of oxide 26, e.g. silicon oxide or oxide compound else, is deposited to a thickness of about 1000~2000 Å by atmosphere pressure chemical vapor deposition (APCVD) to cover the entire substrate structure. Then, a photoresist mask (not shown) is formed to define the oxide layer 26. The oxide layer 26 is selectively removed by etching, e.g. dry etching, through down to the surface of the substrate 20 to form a contact opening 28 exposing the source/drain regions 24b, e.g. source regions, for a bit line. After the contact opening is formed, the photoresist mask is removed. The spacers 25 comprise silicon nitride material, hence they could be used as etching protection layers. Therefore, the etching procedure here could be a self-aligned contact (SAC) etching step.

Figure 5C:
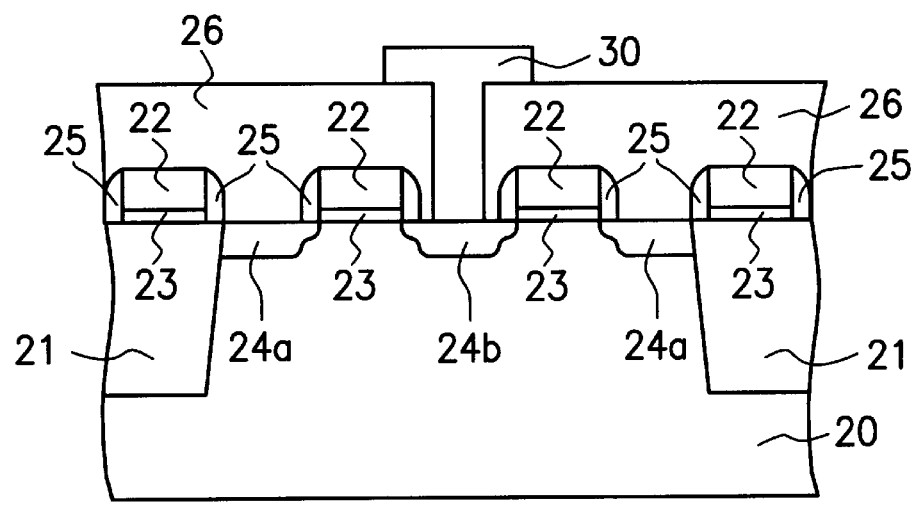

Referring to FIG. 5C, a layer of doped polysilicon is deposited to a thickness of about 1000 Å by LPCVD to cover the entire substrate structure, and is filled into the contact opening 28 to make contacting with the source/drain regions 24b, e.g. source regions to form the second polysilicon layer 30. Thereafter, the second polysilicon layer 30 is patterned by the conventional photolithographic method to form the structure illustrated in FIG. 5C, wherein the second polysilicon layer 30 is used as the bit line of the capacitor.

Figure 5D:
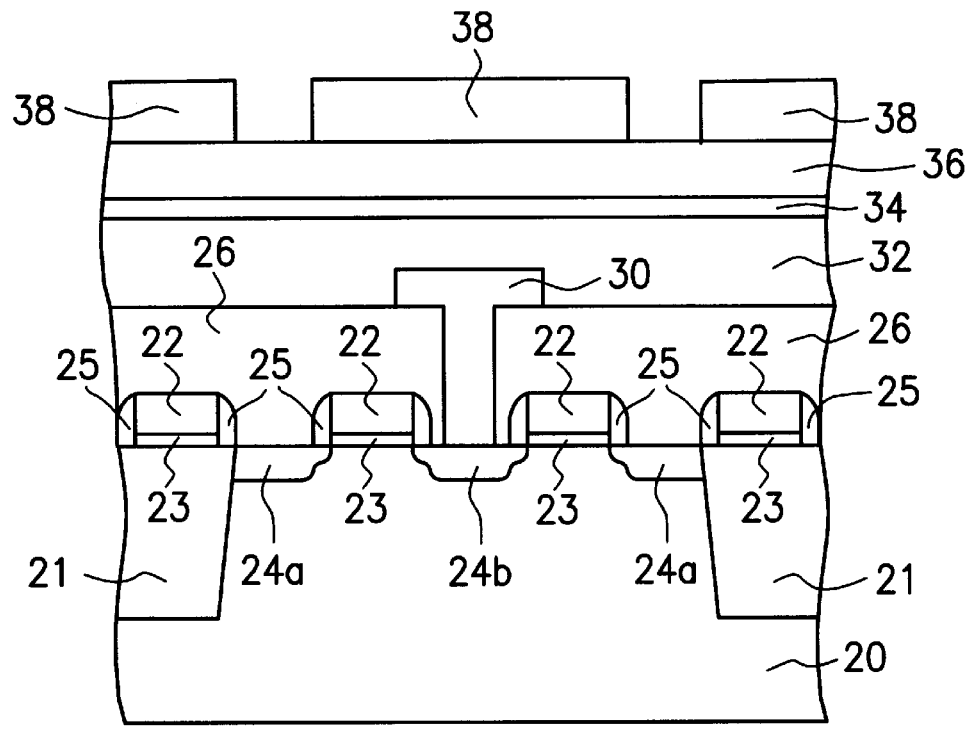

Referring to FIG. 5D, then, a layer of oxide 32 is deposited to a thickness of about 1500 Å by APCVD to cover the surface of the second polysilicon layer 30 and oxide layer 26. Thereafter, a layer of silicon nitride 34 is deposited to a thickness of about 300 Å by PECVD covering the oxide layer 32. Next, a layer of oxide 36 is deposited to a thickness of about 1500 Å by PECVD covering the surface of the silicon nitride layer 34, wherein the material for the oxide layer 36 comprises borophosphosilicate glass (BPSG). Thereafter, a photoresist mask 38 is formed to define a pattern area of the oxide layer 36.

Figure 5E:
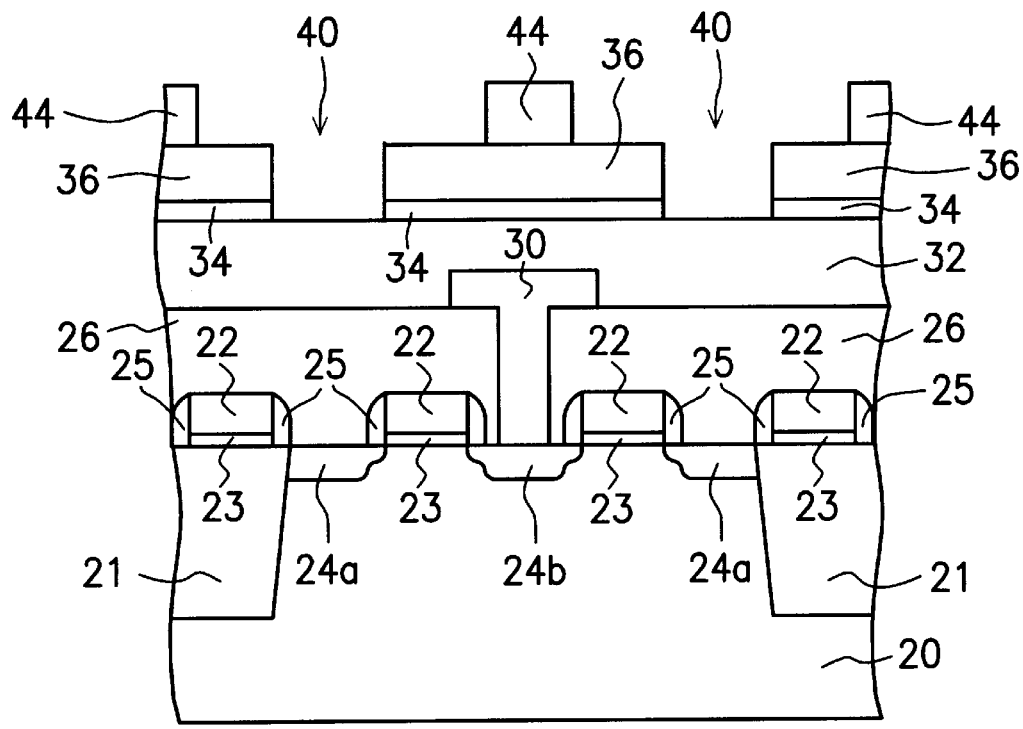

Referring to FIG. 5E, the pattern area of the oxide layer 36 defined by the photoresist mask 38 and the silicon nitride layer 34 directly below the oxide layer 36 are etched to form an opening 40 exposing the oxide layer 32. After the opening 40 is formed, the photoresist mask 38 is removed. A photoresist mask 44 is used to define a pattern area of the oxide layer 36.

Figure 5F:
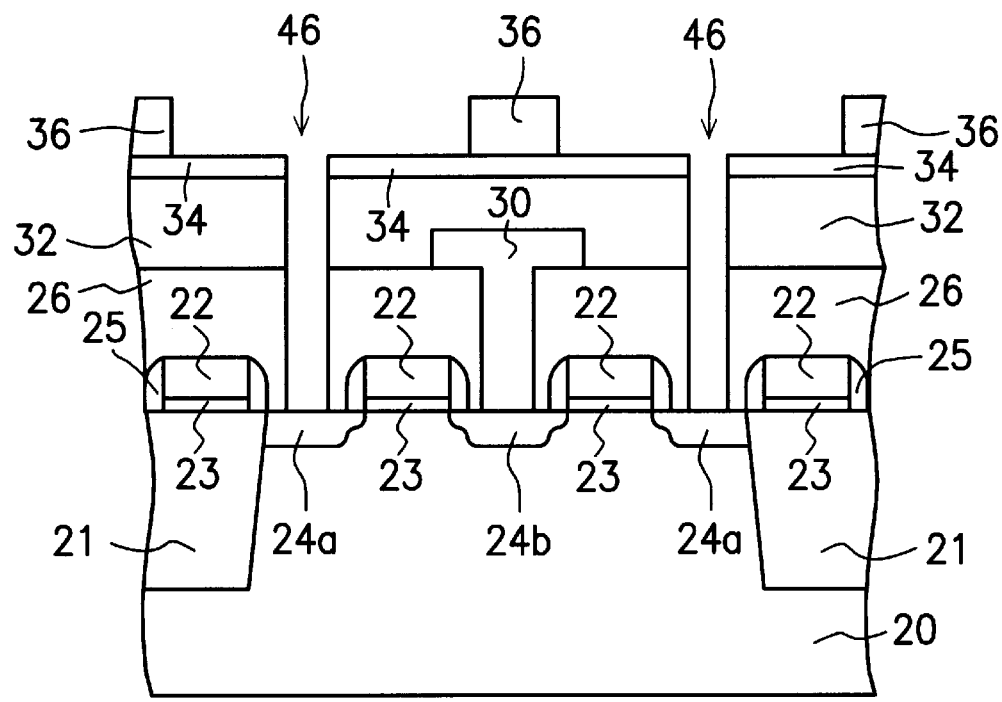

Referring to FIG. 5F, the pattern area of the oxide layer 36 defined by the photoresist mask 44 is etched and the silicon nitride layer 34 is used as an etching stop to expose the silicon nitride layer 34. Meanwhile, the oxide layer 32 exposed by the opening 40 and oxide layer 26 directly below the oxide layer 32 are etched by this etching procedure to form a contact opening 46 exposing the source/drain regions 24a, e.g. drain regions. The oxide layer 36 with the structure as shown in FIG. 5F is used to define a region for the capacitor.

Figure 5G:
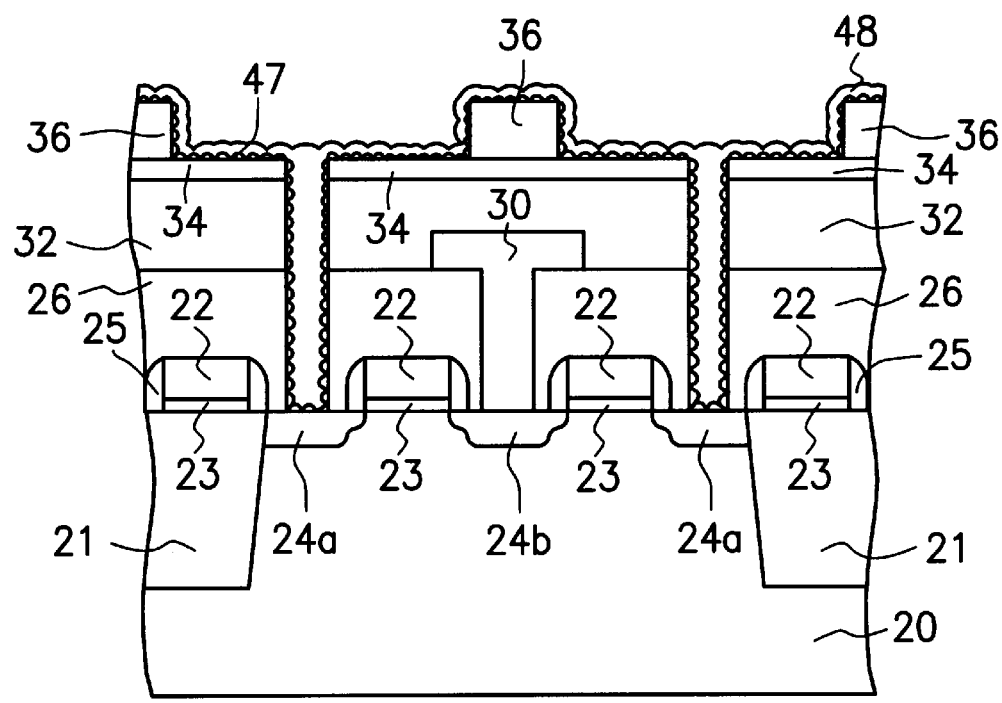

Referring to FIG. 5G, a doped hemispherical Grained silicon layer 47 is deposited over the entire substrate structure which includes the surface of the oxide layer 36 and the silicon nitride layer 34, by LPCVD, covering the sidewalls of the contact opening 46, and contacting with the source/drain regions, e.g. source regions, on the substrate 20 through the contact opening 46. Thereafter, a doped third polysilicon layer 48 is deposited to a thickness of about 1000 Å over the hemispherical grained silicon layer 47 by PECVD. The cylinder shape bottom electrode of the capacitor is constructed by the hemispherical grained silicon layer 47 and the third polysilicon layer 48.

The hemispherical grained silicon layer 47 and the third polysilicon layer 48 are formed in sequence in the present invention, therefore both the third polysilicon layer 48 and the hemispherical grained silicon layer 47 have the roughness surface. Therefore, the surface of the bottom electrode is increased to increase the capacitance of the capacitor.

Figure 5H:
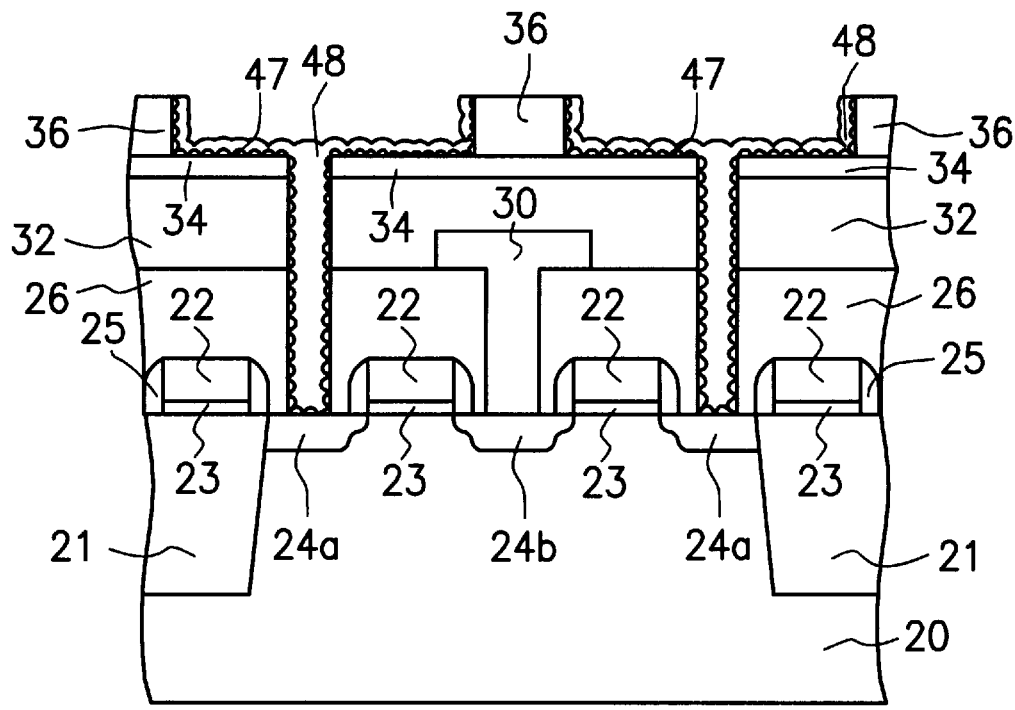

Referring to FIG. 5H, the third polysilicon layer and the hemispherical grained silicon layer 47 are removed by, for example, chemical mechanical polishing (CMP) exposing the surface of the oxide layer 36.

Figure 5I:
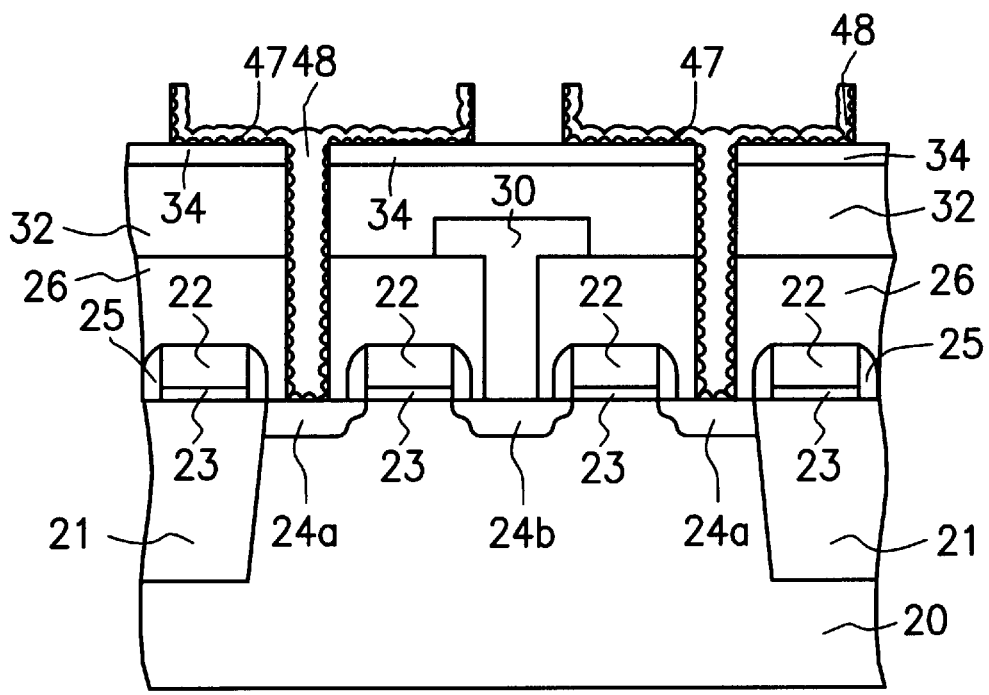

Referring to FIG. 5I, the exposed oxide layer 36 is removed by, for example, wet etching having the high oxide/polysilicon etching rate ratio to form the structure as illustrated in FIG. 5I. The hemispherical grained silicon layer 47 and the third polysilicon layer 48 are formed in sequence in the present invention, therefore the third polysilicon layer 48 is used as an etching protection to prevent the capacitor from current leakage.

Figure 5J:
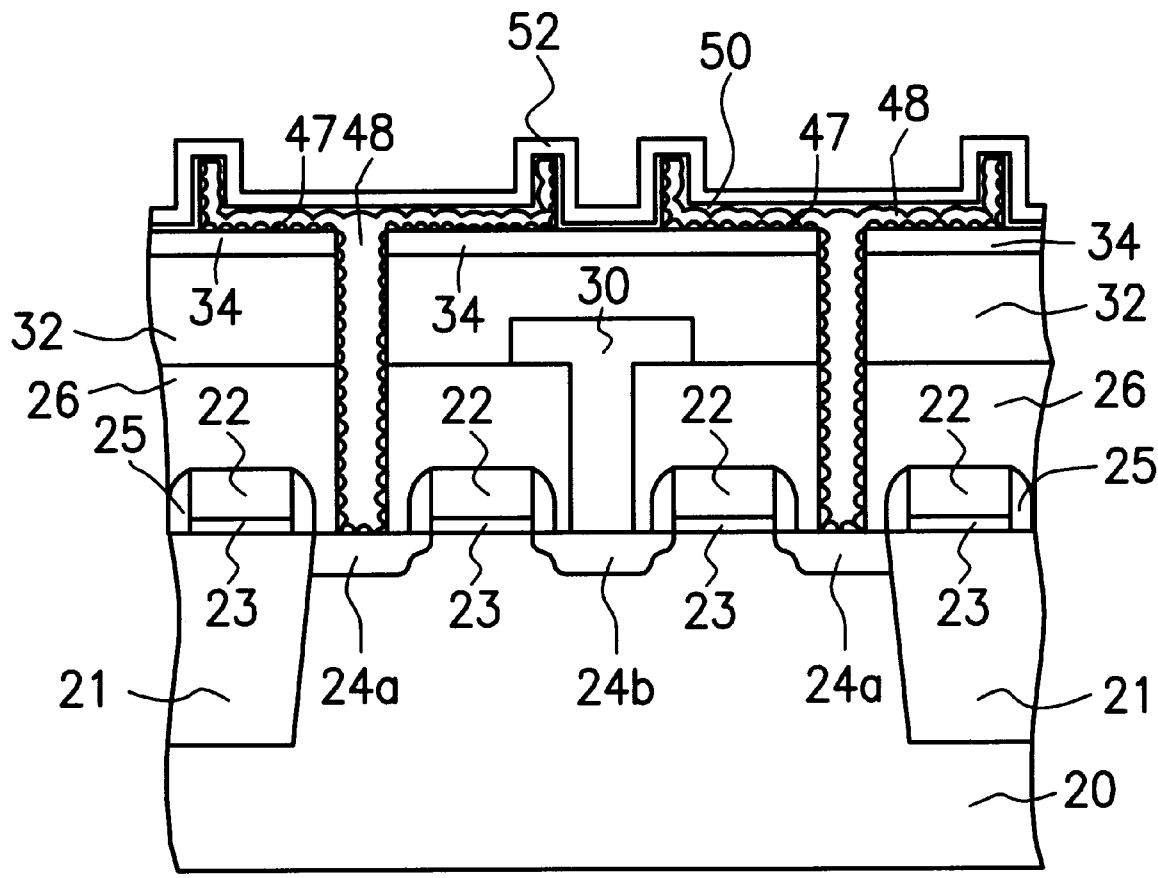

Referring to FIG. 5J, a dielectric layer 50 is formed over the bottom electrode. Later, a layer of conductive material is deposited to a thickness of about 500~1000 Å over the dielectric layer 50 to form the fourth polysilicon layer 52. The fourth polysiliocn layer 52 is used as a top electrode of the capacitor. The dielectric layer 50 could be a three layer structure, e.g., oxide/nitride/oxide (ONO) layers or other materials could be used, such as tantalum oxide. If the tantalum oxide dielectric layer 50 is used, then the tantalum oxide or other materials, such as titanium/titanium nitride are utilized as the fourth polysilicon layer.

Finally, subsequent conventional processes for the complete formation of capacitor structure are performed. Since the conventional processes are not closely related to the subject of the invention, they will not be described herein.

One of the characteristics of the invention is that the hemispherical grained silicon layer 47 and third polysilicon layer 48 are formed in sequence, therefore both the hemispherical grained silicon layer 47 and the third polysilicon layer 48 have rough surfaces. Therefore, the invention is effective in increasing the capacitance of the capacitor.

The hemispherical grained silicon layer 47 and the third polysilicon layer 48 are formed in sequence in the present invention, hence the third polysilicon layer 48 could be used as an etching protection. Therefore, the invention is effective in preventing the formation of the current leakage.

The cylinder shape bottom electrode is formed to increase the surface area of the bottom electrode, and the tantalum oxide dielectric layer 50 having a high dielectric constant is used to increase the capacitance of the capacitor. It is therefore the capacitor maintains a required capacitance while reducing the horizontal dimensions of the storage capacitor.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a capacitor structure for a dynamic random access memory, comprising the steps of:
   providing a transistor on a semiconductor substrate, wherein the transistor includes source/drain regions and a gate electrode having sidewalls thereon, and spacers cover the sidewalls of the gate electrode;
   forming a first oxide layer over the transistor, the first oxide layer having a first contact opening exposing the source region of the transistor;
   depositing a bit line into the contact opening and make contacting with the source region of the transistor;
   forming a second oxide layer over the bit line and the first oxide layer;
   forming a silicon nitride layer over the second oxide layer;
   forming a third oxide layer over the silicon nitride layer;
   patterning the third oxide layer and the silicon nitride layer to form an opening exposing the second oxide layer;
   using a photoresist mask to expose the portions of the third oxide layer;
   etch removing the portions of the third oxide layer until the silicon nitride is exposed, and further removing the second oxide layer and the exposed first oxide layer to form a second contact opening exposing the drain region of the transistor;
   removing the photoresist mask;
   depositing a hemispherical grained silicon layer over the third oxide layer, the silicon nitride layer and the sildewalls of the second contact opening, and make contacting with the drain region exposed by the second contact opening;
   forming a polysilicon layer over the hemispherical grained silicon layer and into the second contact opening;
   removing the polysilicon layer and the hemispherical grained silicon layer over the third oxide layer until the third oxide layer is exposed to form a bottom electrode;
   further removing the third oxide layer exposed until the silicon nitride is exposed;
   forming a dielectric layer over the bottom electrode; and
   forming a top electrode over the dielectric electrode.

2. A method according to claim 1, wherein the bit line forming step includes using a low pressure chemical vapor deposition method.

3. A method according to claim 1, wherein the first oxide layer formation step includes using a atmosphere pressure chemical vapor deposition method.

4. A method according to claim 1, wherein the second oxide layer formation step includes using a atmosphere pressure chemical vapor deposition method.

5. A method according to claim 1, wherein the third oxide layer formation step includes using a plasma enhanced chemical vapor deposition method.

6. A method according to claim 1, wherein the silicon nitride layer formation step includes using a plasma enhanced chemical vapor deposition method.

7. A method according to claim 1, wherein the second contact opening formation step includes using an etching method having a high oxide/nitride etching rate ratio.

8. A method according to claim 1, wherein the hemispherical grained silicon layer formation step includes using a low pressure chemical vapor deposition method.

9. A method according to claim 1, wherein the polysilicon layer formation step includes using a low pressure chemical vapor deposition method.

10. A method according to claim 1, wherein the polysilicon layer removing step which is over the third oxide layer includes using a chemical mechanical polishing method.

11. A method according to claim 1, wherein the spacers comprises silicon nitride.

12. A method according to claim 1, wherein the bit line comprises doped polysilicon.

13. A method according to claim 1, wherein the third oxide layer comprises borophosphosilicate glass.

14. A method according to claim 1, wherein the dielectric layer comprises oxide/nitride/oxide layers.

15. A method according to claim 1, wherein the dielectric layer comprises tantalum oxide.

16. A method according to claim 15, wherein the top electrode comprises titanium/titanium nitride layers.

* * * * *